(12) United States Patent  
Kawaguchi

(10) Patent No.: US 10,361,058 B2  
(45) Date of Patent: Jul. 23, 2019

(54) ION GENERATOR

(71) Applicant: SUMITOMO HEAVY INDUSTRIES ION TECHNOLOGY CO., LTD., Tokyo (JP)

(72) Inventor: Hiroshi Kawaguchi, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/912,139

(22) Filed: Mar. 5, 2018

(65) Prior Publication Data

US 2018/0254166 A1 Sep. 6, 2018

(30) Foreign Application Priority Data

Mar. 6, 2017 (JP) ................. 2017-041654

(51) Int. Cl.
| | |
|---|---|
| *H01J 37/08* | (2006.01) |
| *H01J 27/26* | (2006.01) |
| *H01J 27/08* | (2006.01) |
| *H01J 27/20* | (2006.01) |
| *H01J 37/317* | (2006.01) |

(52) U.S. Cl.
CPC ............. *H01J 37/08* (2013.01); *H01J 27/08* (2013.01); *H01J 27/205* (2013.01); *H01J 27/26* (2013.01); *H01J 37/3171* (2013.01); *H01J 2237/061* (2013.01)

(58) Field of Classification Search
CPC .. H01J 37/08; H01J 27/08; H01J 27/26; H01J 37/3171; H01J 2237/061

USPC .............. 250/423 R, 424, 423 P, 423 F
See application file for complete search history.

(56) References Cited

U.S. PATENT DOCUMENTS

| | | | |
|---|---|---|---|
| 4,620,102 A | 10/1986 | Watanabe et al. | |
| 7,947,129 B2 | 5/2011 | Murata et al. | |
| 2004/0168637 A1* | 9/2004 | Gorokhovsky | C23C 14/022 118/723 ER |
| 2009/0212232 A1* | 8/2009 | Yamashita | H01J 27/022 250/423 R |
| 2013/0249400 A1* | 9/2013 | Sato | H01J 27/024 315/111.81 |
| 2016/0351379 A1* | 12/2016 | Sato | H01J 37/32669 |

FOREIGN PATENT DOCUMENTS

| | | |
|---|---|---|
| JP | S60-084755 A | 5/1985 |
| JP | H02-034410 B2 | 8/1990 |
| JP | H07-254386 A | 10/1995 |
| JP | H10-031963 A | 2/1998 |
| JP | 4256142 B2 | 4/2009 |
| JP | 4374487 B2 | 12/2009 |

* cited by examiner

*Primary Examiner* — Nicole M Ippolito
(74) *Attorney, Agent, or Firm* — Michael Best & Friedrich LLP

(57) ABSTRACT

An ion generator includes an arc chamber which has a plasma generating region therein, a cathode configured to emit a thermoelectron toward the plasma generating region, a repeller which faces the cathode in an axial direction in a state where the plasma generating region is interposed between the cathode and the repeller, and a cage which is disposed to partially surround the plasma generating region at a position between an inner surface of the arc chamber and the plasma generating region.

18 Claims, 12 Drawing Sheets

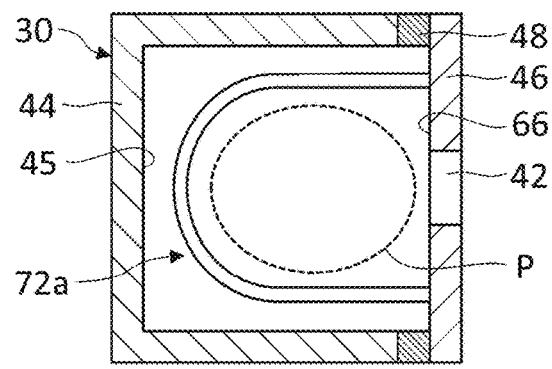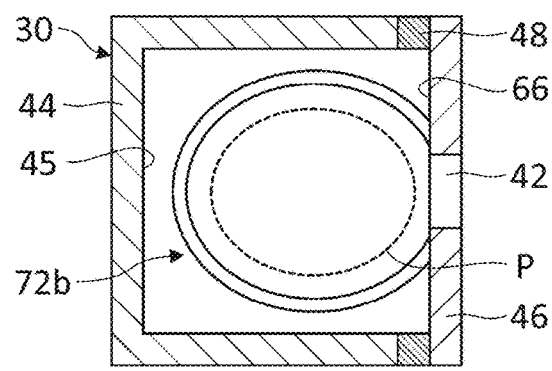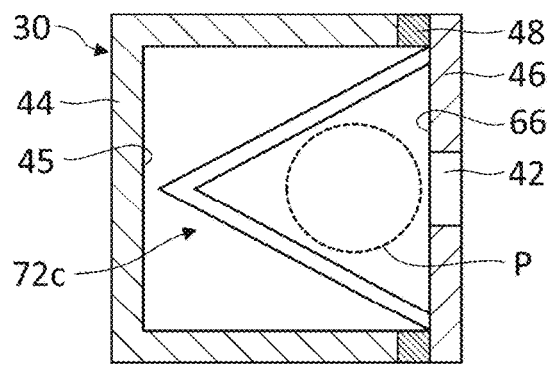

ION GENERATOR

RELATED APPLICATIONS

Priority is claimed to Japanese Patent Application No. 2017-041654, filed Mar. 6, 2017, the entire content of which is incorporated herein by reference.

BACKGROUND

Technical Field

Certain embodiments relate to an ion generator.

Description of Related Art

An ion generator is used as an ion source which is mounted on a device such as an ion implanter which irradiates ions to a workpiece. In the ion irradiation device, in general, in order to perform an irradiation process and another irradiation process with a different recipe (for example, a recipe having a different ion species and a different energy), switching of ion beam conditions between these processes is performed. In most cases, the switching of the ion beam conditions includes switching of ion generation conditions operated by the ion generator.

SUMMARY

According to an embodiment of the present invention, there is provided an ion generator, including: an arc chamber which has a plasma generating region therein; a cathode configured to emit a thermoelectron toward the plasma generating region; a repeller which faces the cathode in an axial direction in a state where the plasma generating region is interposed between the cathode and the repeller; and a cage which is disposed to partially surround the plasma generating region at a position between an inner surface of the arc chamber and the plasma generating region.

BRIEF DESCRIPTION OF THE DRAWINGS

FIGS. 9A to 9C are sectional views schematically showing configurations of cases of Modification Example 1.

DETAILED DESCRIPTION

Figure 1:
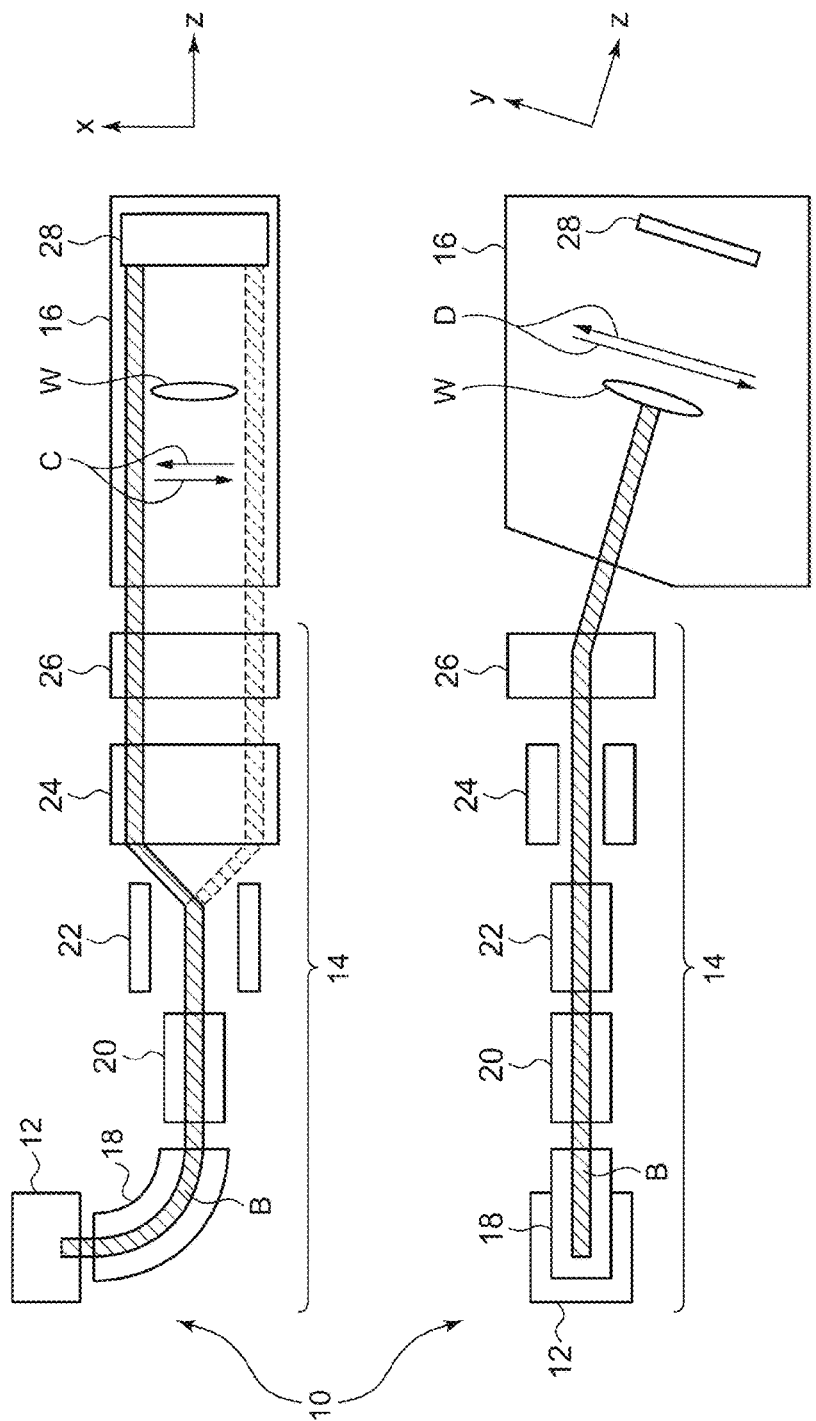
FIG. 1 is a view schematically showing an ion implanter according to an embodiment.

Immediately after ion generation conditions are switched, a quality of an ion beam is not necessarily stable enough. Therefore, it is necessary to wait for stabilization of ion beam for a while from a start of an operation of a new ion generation condition. In order to improve productivity of an ion irradiation device, it is desirable to shorten this waiting time.

It is desirable to provide an ion generator useful for improving the productivity of the ion irradiation device.

It is to be noted that any combination of the above constituent elements and any mutual substitution of constituent elements and expressions of the present invention among methods, devices, systems, or the like are also effective as aspects of the present invention.

According to the present invention, it is possible to provide an ion generator useful for improving the productivity of the ion irradiation device and a control method of the ion irradiation device.

Hereinafter, an embodiment of the present invention will be described in detail with reference to the drawings. In descriptions of the drawings, the same reference numerals are assigned to the same elements, and redundant descriptions thereof are appropriately omitted. The following configurations are only examples, and the scope of the present invention is not limited by the configurations.

FIG. 1 is a view schematically showing an ion implanter 10 according to the embodiment. An upper portion in FIG. 1 is a top view showing a schematic configuration of the ion implanter 10, and a lower portion in FIG. 1 is a side view showing the schematic configuration of the ion implanter 10.

The ion implanter 10 is configured to implant ions to a surface of a workpiece in a vacuum. For example, the workpiece is a substrate W or a semiconductor wafer. Hereinafter, for convenience of explanation, the workpiece is referred to as the substrate W or the semiconductor wafer. However, this is not intended to limit an implantation target to a specific object.

The ion implanter 10 is configured to irradiate an ion beam B to the entire surface of the substrate W by at least one of a beam scan and a mechanical scan. In the present specification, for convenience of explanation, a traveling direction of the ion beam B on the design is defined as a z direction and a surface perpendicular to the z direction is defined as a xy surface. As described later, in a case where the workpiece is scanned with the ion beam B, a scanning direction is referred to as an x direction, and a direction orthogonal to the z direction and the x direction is referred to as a y direction. Accordingly, the beam scan is performed in the x direction and the mechanical scan is performed in the y direction.

The ion implanter 10 includes an ion generator 12, a beamline unit 14, and an implantation process chamber 16. The ion generator 12 is configured to provide the ion beam B to the beamline unit 14. The beamline unit 14 is configured to transport ions from the ion generator 12 to the implantation process chamber 16. The ion implanter 10 includes an evacuation system (not shown) for providing a desired vacuum environment to the ion generator 12, the beamline unit 14, and the implantation process chamber 16.

For example, as shown in FIG. 1, the beamline unit 14 includes amass analyzing magnet device 18, abeam shaping device 20, a deflection scanning device 22, a beam parallelizing device 24 such as a P lens, and an angular energy filter 26 in order from the upstream side. In the present specification, the upstream side indicates a side close to the ion generator 12 and a downstream side indicates a side close to the implantation process chamber 16.

The mass analyzing magnet device 18 is provided on the downstream side of the ion generator 12 and is configured to select necessary ion species out of the ion beam B extracted from the ion generator 12 by mass analysis. The beam shaping device 20 includes a focusing/defocusing lens such as a Q lens and is configured to shape the ion beam B into a desired sectional shape.

The deflection scanning device 22 is configured to provide the beam scan. The deflection scanning device 22 scans the ion beam B in the x direction. Accordingly, the ion beam B is scanned over a scanning range in the x direction, which is longer than a beam width in the y direction. In FIG. 1, the beam scanning direction and the scanning range thereof are exemplified by an arrow C, and the ion beams B on one end and the other end of the scanning range are respectively indicated by solid lines and dashed lines. For the sake of clarity, the ion beams B are shown to be hatched.

The beam parallelizing device 24 is configured to parallelize the traveling direction of the scanned ion beam B. The angular energy filter 26 is configured to analyze the energy of the ion beam B, deflect ions having a desired energy downward, and lead the ions to the implantation process chamber 16. In this way, the beamline unit 14 supplies the ion beam B to be irradiated to the substrate W to the implantation process chamber 16.

The implantation process chamber 16 includes an object holding unit (not shown) which is configured to hold one or a plurality of substrates W and provide a relative movement (so-called mechanical scan) with respect to the ion beam B in the y direction to the substrate W if necessary, for example. In FIG. 1, the mechanical scan is exemplified by an arrow D. The implantation process chamber 16 includes a beam stopper 28 at a termination of a beamline. In a case where the substrate W does not exist on a trajectory of the ion beam B, the ion beam B is incident into the beam stopper 28.

In another embodiment, the ion implanter 10 may be configured to supply an ion beam having a cross section which is considerably long in one direction perpendicular to the z direction to the implantation process chamber 16. For example, the ion beam has a width in the x direction which is longer than the width in the y direction. The ion beam having the elongated cross section maybe referred to as a ribbon beam. In still another embodiment, the ion implanter 10 may be configured to supply an ion beam having a spot-shaped cross section to the implantation process chamber 16 without scanning the ion beam.

Figure 2:
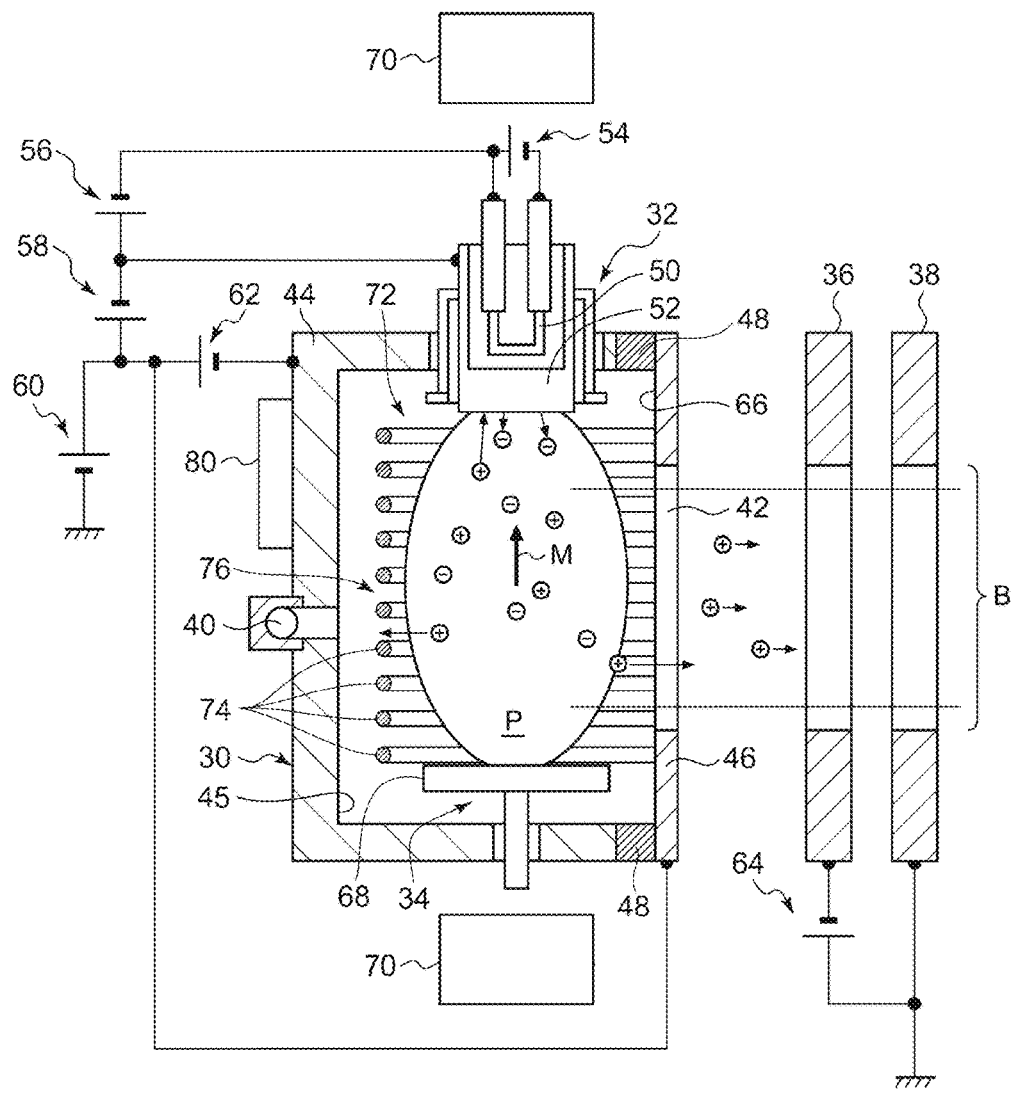
FIG. 2 is a sectional view schematically showing a configuration of the ion generator according to the embodiment.

FIG. 2 is a sectional view schematically showing a configuration of the ion generator 12 according to the embodiment. The ion generator 12 is an ion source with an indirectly heated cathode and includes an arc chamber 30, a thermoelectron emitting portion 32, a repeller 34, a first extraction electrode 36, a second extraction electrode 38, a cage 72, and various power supplies.

The arc chamber 30 has an approximately rectangular parallelepiped box shape. The arc chamber 30 has an elongated shape in one direction, and hereinafter, the one direction is referred to as an axial direction of the arc chamber 30. The axial direction is an up-down direction on a paper surface of FIG. 2.

The arc chamber 30 is configured of a high melting point material, specifically, a high melting point metal such as tungsten (W), molybdenum (Mo), or tantalum (Ta), alloys thereof, graphite (C), or the like. Accordingly, the arc chamber is not easily melted even in an environment where a temperature inside the arc chamber is considerably high.

The thermoelectron emitting portion 32 is provided on one side in the axial direction of the arc chamber 30. The repeller 34 is provided on the other side in the axial direction of the arc chamber 30. The repeller 34 faces the thermoelectron emitting portion 32. Hereinafter, for convenience of explanation, aside of the thermoelectron emitting portion 32 in the arc chamber 30 is referred to as an upper side, and a side of the repeller 34 in the arc chamber 30 is referred to as a lower side.

The descriptions such as the "upper side" and the "lower side" are merely used for the convenience of explanation, and this does not mean that the thermoelectron emitting portion 32 should be disposed on the upper side in the vertical direction and the repeller 34 should be disposed on the lower side in the vertical direction when the ion generator 12 is used. In the ion generator 12, the thermoelectron emitting portion 32 may be disposed on the lower side in the vertical direction and the repeller 34 may be disposed on the upper side in the vertical direction. The ion generator 12 may be disposed such that the axial direction thereof becomes the horizontal direction or the axial direction thereof becomes inclined to the vertical direction and the horizontal direction.

A gas inlet 40 through which a material gas is introduced is provided on one side portion of the arc chamber 30. A front slit 42 which is an opening through which the ion beam B is extracted is formed on the other side portion of the arc chamber 30.

The material gas includes rare gas, or hydride such as hydrogen ($H_2$), phosphine ($PH_3$), or arsine ($A_5H_3$), or halide which is fluorides such as boron trifluoride ($BF_3$) or germanium tetrafluoride ($GeF_4$), chloride such as indiumtri chloride ($InCl_3$), or the like. The material gas may include substances containing oxygen atoms (O) such as carbon dioxide ($CO_2$), carbon monoxide (CO), or oxygen ($O_2$).

The arc chamber 30 includes a chamber body 44, a slit member 46, and an insulating member 48. The front slit 42 is formed in the slit member 46. The chamber body 44 is a box member in which one side portion is open. The slit member 46 is a cover which is attached to the open side of the chamber body 44 and is fixed to the chamber body 44 via the insulating member 48. By attaching the slit member 46 to the open side of the chamber body 44, a plasma chamber of the ion generator 12 is formed. The thermoelectron emitting portion 32, the repeller 34, and the gas inlet 40 are provided in the chamber body 44.

The slit member 46 is connected to a positive terminal of an extraction power supply 60 and a high positive voltage is applied to the slit member 46 by the extraction power supply 60. The chamber body 44 is connected to a negative terminal of a chamber power supply 62, and thus, a negative voltage is applied to the chamber body 44 with respect to the slit member 46. For example, the chamber power supply 62 is configured to apply a voltage which is one to five times an arc power supply 58 described later to the chamber body 44.

The front slit 42 is an elongated slit which extends from the upper side of the slit member 46 to the lower side thereof. This vertically long hole has a larger area than that of a small hole such as a circular hole, and thus, it is possible to increase an amount of the ion beams extracted from the ion generator 12.

For convenience of explanation, a direction in which the front slit 42 extends is referred to as a slit longitudinal direction. The slit longitudinal direction corresponds to the axial direction of the arc chamber 30. The slit longitudinal direction is orthogonal to a beam extraction direction of the ion generator 12. A direction orthogonal to both the slit longitudinal direction and the beam extraction direction is referred to as a slit width direction. Accordingly, the cross section shown in FIG. 2 is a cross section formed by a plane parallel to both the slit longitudinal direction and the beam extraction direction. In the paper surface of FIG. 2, the slit longitudinal direction is the up-down direction, the beam extraction direction is a right-left direction, and a slit width direction is a direction perpendicular to the paper surface.

The cage 72 is provided inside the arc chamber 30. The cage 72 is positioned between an inner surface of the arc chamber 30 and a region (referred to as a plasma generating region) in which plasma P is generated and is disposed to partially surround the plasma generating region. The cage 72 includes a plurality of wire members 74 which are arranged with intervals in the axial direction and is formed in a cage shape or a fence shape. Gaps 76 are provided between adjacent wire members 74 and the material gas introduced from the gas inlet 40 flows into the plasma generating region through the gaps 76 of the cage 72. Accordingly, the cage 72 is configured such that a flow of gas crossing the cage 72 is generated in a radial direction orthogonal to the axial direction.

Similarly to the arc chamber 30, the cage 72 is configured of a high melting point material, specifically, a high melting point metal such as tungsten (W), molybdenum (Mo), or tantalum (Ta), alloys thereof, graphite (C), or the like. Accordingly, the cage 72 is not easily melted in an environment where a temperature of the cage 72 is considerably high during the generation of the plasma P.

The cage 72 is provided along three side portions of the chamber body 44 and is disposed to partition a portion between the plasma generating region and an inner surface 45 of the chamber body 44. The cage 72 is fixed to an inner surface 66 of the slit member 46 and is disposed to be away from the inner surface 45 of the chamber body 44. The same positive voltage as the slit member 46 is applied to the cage 72, and thus, the plasma P is confined in a space inside the cage 72. The cage 72 is heated by the plasma P and the temperature of the cage 72 becomes a high temperature of several hundreds degree Celsius or more.

The thermoelectron emitting portion 32 emits thermoelectrons into the arc chamber 30 and includes a filament 50 and a cathode 52. The thermoelectron emitting portion 32 is inserted into a cathode attachment hole of the chamber body 44 and is fixed in a state insulated from the arc chamber 30. In association with the thermoelectron emitting portion 32, a filament power supply 54, a cathode power supply 56, and the arc power supply 58 are provided.

The filament 50 is heated by the filament power supply 54, and thus, thermoelectrons are generated from a tip of the filament 50. Primary thermoelectrons generated from the filament 50 are accelerated by a cathode electric field formed by the cathode power supply 56. The primary thermoelectrons collide with the cathode 52, and thus, the cathode 52 is heated by heat generated at the time of the collision. The heated cathode 52 generates secondary thermoelectrons.

An arc voltage is applied between the cathode 52 and the cage 72 by the arc power supply 58 and the secondary thermoelectrons are accelerated by the arc voltage. The secondary thermoelectrons are emitted to the inside of the cage 72 as beam electrons with sufficient energy to ionize gas molecules. Since the beam electrons are within a range approximately limited by a magnetic field M, ions are mainly generated within the range. The beam electrons reach the inner wall of arc chamber 30, slit member 46, cathode 52, repeller 34, and cage 72 by diffusion, and are lost on the walls.

The repeller 34 includes a repeller plate 68. The repeller plate 68 is provided to be approximately parallel to the cathode 52 so as to face the cathode 52. The repeller plate 68 bounces electrons in the arc chamber 30 to accumulate the electrons in the plasma generating region so as to increase ion generation efficiency.

The cage 72 is disposed to avoid a position between the plasma generating region and the cathode 52 and a position between the plasma generating region and the repeller 34 so as not to hinder reciprocating motions of the beam electrons between the cathode 52 and the repeller 34. Accordingly, the cage 72 is formed so as not to have a partition which is configured in a plane orthogonal to the axial direction.

The cage 72 is disposed to avoid a position between the plasma generating region and the front slit 42 so as not to hinder the extraction of the ion beam B from the front slit 42. Therefore, the cage 72 is formed so as not to have a partition configured along the inner surface 66 of the slit member 46.

A magnetic field generator 70 is provided in the ion generator 12. The magnetic field generator 70 is disposed outside the arc chamber 30. The magnetic field generator 70 includes a pair of magnetic-field coils, one thereof is positioned above the arc chamber 30, and the other thereof is positioned below the arc chamber 30. The magnetic field M is applied to the inside of the arc chamber 30 by the magnetic field generator 70. The magnetic field M is applied in the axial direction of the arc chamber 30.

The beam electrons emitted from the cathode 52 to the arc chamber 30 reciprocate between the cathode 52 and the repeller 34 along the magnetic field M. The reciprocating beam electrons collide with molecules of the material gas introduced to the arc chamber 30 and ionize the molecules of the material gas to generate ions, and thus, the plasma P is generated in the arc chamber 30. Since the arc chamber 30 is elongated, the plasma P is also elongated.

A cooling device 80 is provided outside the arc chamber 30. The cooling device 80 is attached to outside of the chamber body 44 and cools the chamber body 44 heated during the generation of the plasma. By providing the cooling device 80, the temperature of the inner surface 45 of the chamber body 44 is decreased, and thus, substances disposed on the inner surface 45 due to the generation of the plasma P are not easily emitted from the inner surface 45. In other words, the substances disposed on the inner surface 45 of the chamber body 44 are easily accumulated by decreasing the temperature of the chamber body 44.

The first extraction electrode 36 is provided to be adjacent to the outside of the arc chamber 30. The first extraction electrode 36 is disposed with a gap from the slit member 46 in the beam extraction direction. The second extraction electrode 38 is provided to be adjacent to the first extraction electrode 36 on a side opposite to the slit member 46. The second extraction electrode 38 is disposed with a gap from the first extraction electrode 36 in the beam extraction direction.

As shown in the drawings, in each of the first extraction electrode 36 and the second extraction electrode 38, an opening corresponding to the front slit 42 is provided to cause the ion beam B to pass through the opening. Similarly to the front slit 42, the openings have a vertically long shape. For example, each of the first extraction electrode 36 and the second extraction electrode 38 is formed of stainless steel, graphite, molybdenum, or tungsten.

The first extraction electrode 36 is connected to a suppression power supply 64. The suppression power supply 64 is provided to apply a negative electric potential to the first extraction electrode 36 with respect to the second extraction electrode 38. The second extraction electrode 38 is grounded. The first extraction electrode 36 is referred to as a suppression electrode. The second extraction electrode 38 is referred to as a ground electrode.

Beam extraction is performed by an electric field which is generated in the vicinity of the front slit 42 according to a voltage applied to a portion between the first extraction electrode 36 and the slit member 46. The ion beam B is extracted from the plasma through the front slit 42 by this electric field. The ion beam B passes through the openings of the first extraction electrode 36 and the second extraction electrode 38 and is transported to the implantation process chamber 16 by the beamline unit 14, and thus, the substrate W is irradiated with the ion beam B.

Figure 3:
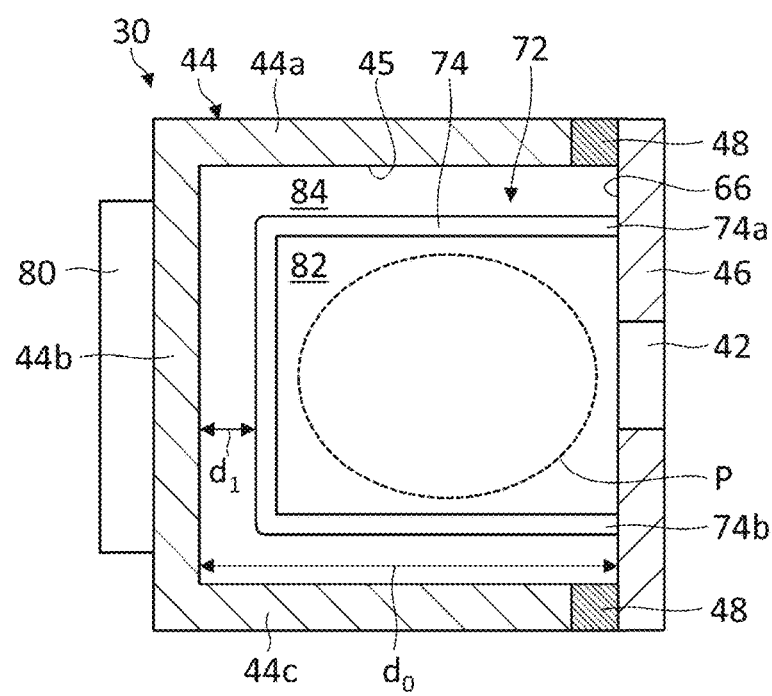
FIG. 3 is a sectional view schematically showing a configuration of a cage.

FIG. 3 is a sectional view schematically showing the configuration of the cage 72 and shows a cross section of the inside of the arc chamber 30 when viewed from the axial direction. As shown in FIG. 3, the cage 72 has a squared U shape (channel shape) when viewed from the axial direction and is disposed to be parallel to each of three side portions 44a, 44b, and 44c of the chamber body 44. Both ends 74a and 74b of the wire member 74 configuring the cage 72 are attached to the inner surface 66 of the slit member 46.

The cage 72 is disposed so as to partition the inside of the arc chamber 30 into the first space 82 and the second space 84. The first space 82 includes a plasma generating region in which the plasma P is generated and communicates with the front slit 42. The second space 84 is a region along the inner surface 45 of the chamber body 44 and is a portion of which a distance from the inner surface 45 of the chamber body 44 is within a predetermined range.

The cage 72 is provided to be away from the inner surface 45 of the chamber body 44. A distance $d_1$ between the cage 72 and the inner surface 45 of the chamber body 44 needs to be large enough to ensure insulation between the cage 72 and the chamber body 44 having electric potentials different from each other. Meanwhile, in order to secure the plasma generating region having a certain size, it is preferable that distance $d_1$ between the cage 72 and the inner surface 45 of the chamber body 44 is as small as possible. Preferably, the distance $d_1$ between the cage 72 and the inner surface 45 of the chamber body 44 is set to 30% or less of an internal dimension $d_0$ of the arc chamber 30, and for example, the distance $d_1$ is approximately 5%, 10%, 15%, or 20% of the internal dimension $d_0$. Here, the internal dimension $d_0$ of the arc chamber 30 is not a dimension in the longitudinal direction of the arc chamber 30 but a dimension of the arc chamber 30 in the lateral direction (slit width direction or beam extraction direction) orthogonal to the longitudinal direction.

Figure 4:
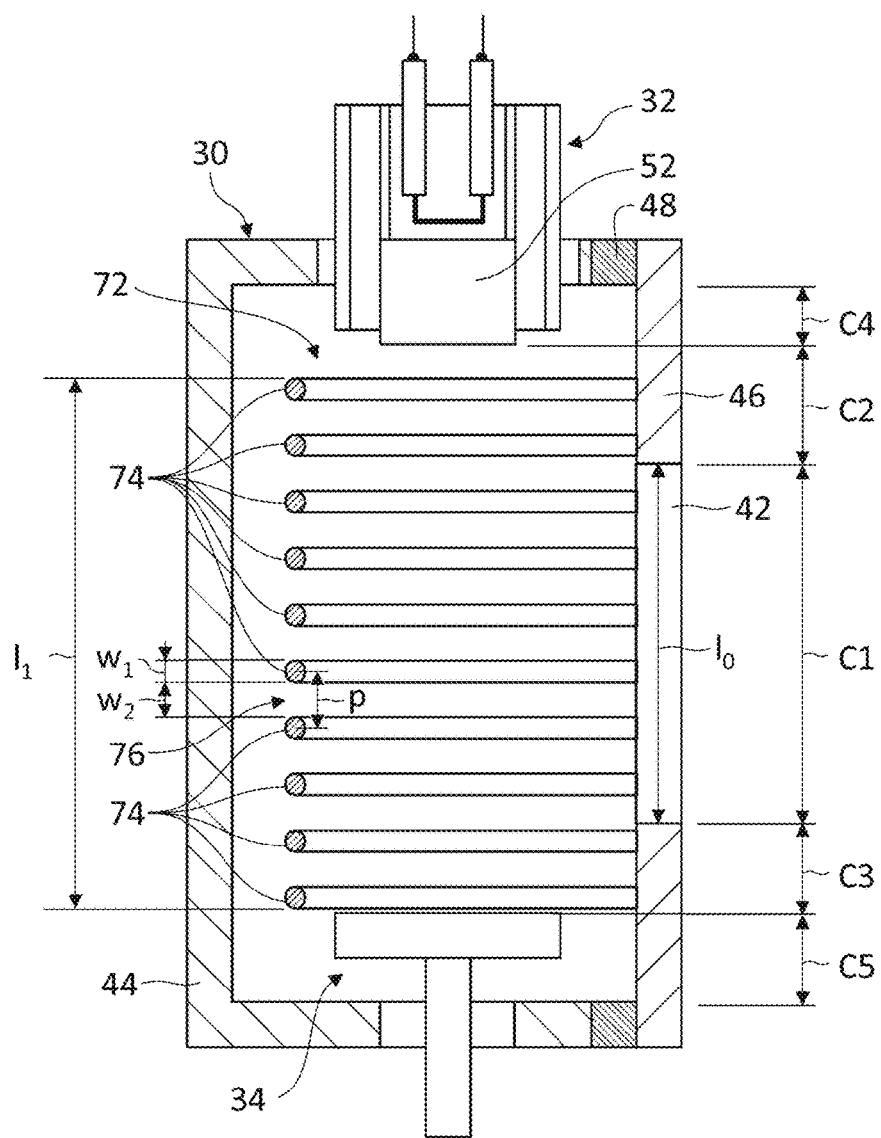
FIG. 4 is a sectional view schematically showing the configuration of the cage.

FIG. 4 is a sectional view schematically showing the configuration of the cage 72 and is a view corresponding to a portion of FIG. 2. In FIG. 4, a range in the axial direction in which the cage 72 is provided is shown in detail. The cage 72 is provided over at least a first section C1 in the axial direction in which the front slit 42 is provided. Preferably, the cage 72 is provided to be positioned in at least a portion of a second section C2 between the front slit 42 and the cathode 52 and at least a portion of a third section C3 between the repeller 34 and the front slit 42. Accordingly, a length $l_1$ of the cage 72 in the axial direction is longer than a length $l_0$ of the front slit 42 in the axial direction (slit longitudinal direction).

The cage 72 may be provided to be positioned in only a portion of the second section C2 and the third section C3 or may be provided to be positioned over the entirety of at least one of the second section C2 and the third section C3. The cage 72 may be provided to be positioned in at least a portion of a fourth section C4 in which the cathode 52 is positioned or may be provided to be positioned in at least a portion of a fifth section C5 in which the repeller 34 is positioned. In a case where the cage 72 is provided in the fourth section C4, the cage 72 is disposed to be positioned outside the thermoelectron emitting portion 32 in the radial direction such that the cage 72 and the thermoelectron emitting portion 32 do not come into contact with each other. Similarly, in a case where the cage 72 is provided in the fifth section C5, the cage 72 is disposed to be positioned outside the repeller 34 in the radial direction such that the cage 72 and the repeller 34 do not come into contact with each other. The cage 72 is disposed to be away from an upper portion and a lower portion of the chamber body 44 so as not to come into contact with the upper portion and the lower portion of the chamber body 44.

As described above, the arc voltage is applied between the cage 72 and the cathode 52, and the cage 72 functions as an anode for generating the plasma in the plasma generating region. A positive voltage is applied to the cage 72 with respect to the chamber body 44, and thus, the cage 72 has a function which confines the plasma P inside the cage 72 to increase the ion generation efficiency. The functions are realized by the wall of the electric field (potential) generated by the cage 72, and thus, ideally, it is preferable that the cage 72 is configured of a plate-shaped member and the gaps 76 are not provided. However, if the gaps 76 are not provided in the cage 72, it is impossible to sufficiently provide the material gas for the plasma P to the inside of the cage 72, and thus, a stable plasma formation is hindered.

From the above-described viewpoint, preferably, a pitch p of the wire members 74 configuring the cage 72 is as small as possible. For example, the pitch p is ⅕ or less of the length $l_1$ of the cage 72 in the axial direction. More preferably, the pitch is 1/10 or less of the length $l_1$. Accordingly, preferably, the number of the plurality of wire members 74 is five or more, or ten or more.

In order to effectively supply the material gas to the inside of the cage 72, preferably, a ratio occupied by the gaps 76 in the cage 72, that is, an opening ratio is 30% or more. Here, the "opening ratio" means an area ratio occupied by the gaps 76 per unit area in a plan view when the cage 72 is viewed from the radial direction. For example, in order to set the opening ratio of the cage 72 to 30% or more, a width $w_1$ of the wire member 74 and a width $w_2$ of the gap 76 satisfy a relation of $w_1/w_2 \leq 2$.

Meanwhile, if the opening ratio of the cage 72 increases, the width $w_1$ of the wire member 74 has to be decreased, and thus, it is difficult to provide the wire member 74 having a sufficient strength. If the width $w_1$ of the wire member 74 is decreased, the function as the wall of the electric field (potential) generated by the cage 72 is decreased. Accordingly, preferably, the opening ratio of the cage 72 is 91% or less. In order to set the opening ratio of the cage 72 to 91% or less, for example, the width $w_1$ of the wire member 74 and the width $w_2$ of the gap 76 satisfy a relation of $w_1/w_2 \geq 0.1$.

Next, effects of the ion generator 12 according to the present embodiment will be described. First, a state change of the inner wall of the arc chamber will be described in a case where ion generation conditions are switched in an ion generator according to Comparative Example. In Comparative Example, the above-described cage 72 and the cooling device 80 are not provided, and the same arc voltage is applied to the arc chamber body and the slit member.

Figure 5:
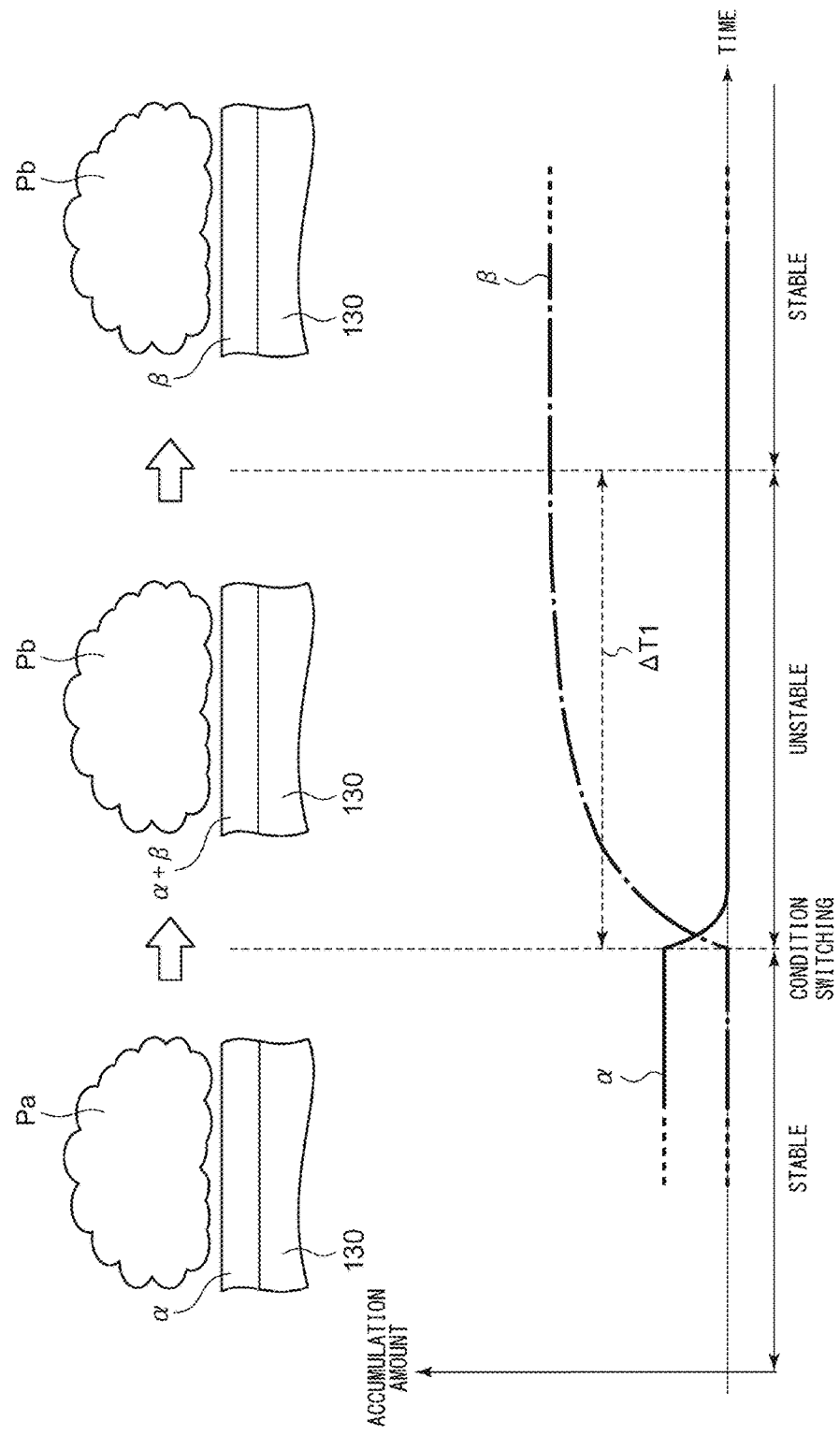
FIG. 5 is a view showing a state change of an inner wall of an arc chamber when ion generation conditions are switched according to Comparative Example.

FIG. 5 is a view showing a state change of an inner wall of an arc chamber 130 in a case were the ion generation conditions are switched according to Comparative Example. The ion generation conditions are the operating conditions of the ion generator and include parameters such as a type of gas used, a flow rate of the gas, input power (for example, arc current and arc voltage) for plasma excitation, and an applied magnetic field. When the ion generation conditions are switched, at least one of the parameters is changed. Hereinafter, for convenience of explanation, a condition before switching is appropriately referred to as "a current ion generation condition" from the fact that the condition is currently operated ion generation condition, and condition after switching is appropriately referred to as "a new ion generation condition" from the fact that the condition is an ion generation condition to be used next.

A left upper portion of FIG. 5 shows a state of the inner wall of the arc chamber 130 when the ion generator according to Comparative Example is continuously operated during a sufficient time in the current ion generation condition. A center upper portion of FIG. 5 shows a state of the inner wall of the arc chamber 130 immediately after the conditions are switched from the current ion generation condition to the new ion generation condition, and a right upper portion of FIG. 5 shows a state of the inner wall of the arc chamber 130 when the ion generator is continuously operated during a sufficient time in the new ion generation condition after the switching. The lower portion of FIG. 5 shows a change of a substance formation amount (for example, thickness of substance layer) on the inner wall of the arc chamber 130 when the conditions are switched from the current ion generation condition to the new ion generation condition.

According to the consideration of the present inventor, different substances maybe formed on the inner wall of the arc chamber 130 depending on the ion generation condition. For example, as shown in the left upper portion of the FIG. 5, a first plasma Pa is generated in the arc chamber 130 in the current ion generation condition, and thus, a first substance α is formed on the inner wall. If the conditions are switched from the current ion generation condition to the new ion generation condition, as shown in the center upper portion of FIG. 5, a second plasma Pb different from the first plasma Pa is formed in the arc chamber 130. Since it is immediately after the switching, the first substance α still remains on the inner wall of the arc chamber 130. As shown in the right upper portion of FIG. 5, if a sufficient time has elapsed from the start of the operation of the new ion generation condition, a second substance β is formed on the inner wall of the arc chamber 130 by the second plasma Pb.

In this way, the switching of the ion generation conditions involves a state transition of the inner wall of the arc chamber 130. As shown in the lower portion of FIG. 5, the first substance α formed in the current ion generation condition is gradually removed from the inner wall, and the second substance β is gradually formed on the inner wall in the new ion generation condition. It is considered that the first substance α removed from the inner wall is evacuated to the outside of the arc chamber 130 together with the ion beam. If the second substance β is formed on the inner wall to some extent, the amount of the second substance β is saturated.

In the transition state shown in the center portion of FIG. 5, a quality of the ion beam extracted from the ion generator 12 is not sufficiently stable. Therefore, it is necessary to wait for stabilization of the ion beam for a while from the start of the operation of new ion generation conditions. This waiting time $\Delta T_1$ may be considerably long depending on a combination of the current ion generation condition and the new ion generation condition. Implantation processing of the ion implanter 10 is not started until the waiting time $\Delta T_1$ elapsed. Accordingly, in order to improve productivity of ion implanter 10, it is desired to shorten the waiting time for ion beam stabilization required with the switching of the ion generation conditions.

According to the consideration of the present inventor, in Comparative Example, the reason why the above-described waiting time $\Delta T_1$ is lengthened is because the temperature of the arc chamber inner wall is relatively high, and thus, the accumulation substances α and β are not easily accumulated and are easily emitted. Typically, the arc chamber 130 is heated by the plasma P and reaches several hundreds Celsius or more. However, from the viewpoint of replacing and stabilizing the accumulation substances α and β on the inner wall of the arc chamber 130 in order to switch the ion generation conditions, it is preferable that the temperature of the arc chamber 130 is low. Accordingly, the present inventor considers that the waiting time caused by the switching of the ion generation conditions can be shortened by disposing the cage 72 inside the arc chamber and dividing functions into the cage 72 having a relatively high temperature for heating the plasma P and the arc chamber 30 having a relatively low temperature for early stabilizing the accumulation substances.

Figure 6:
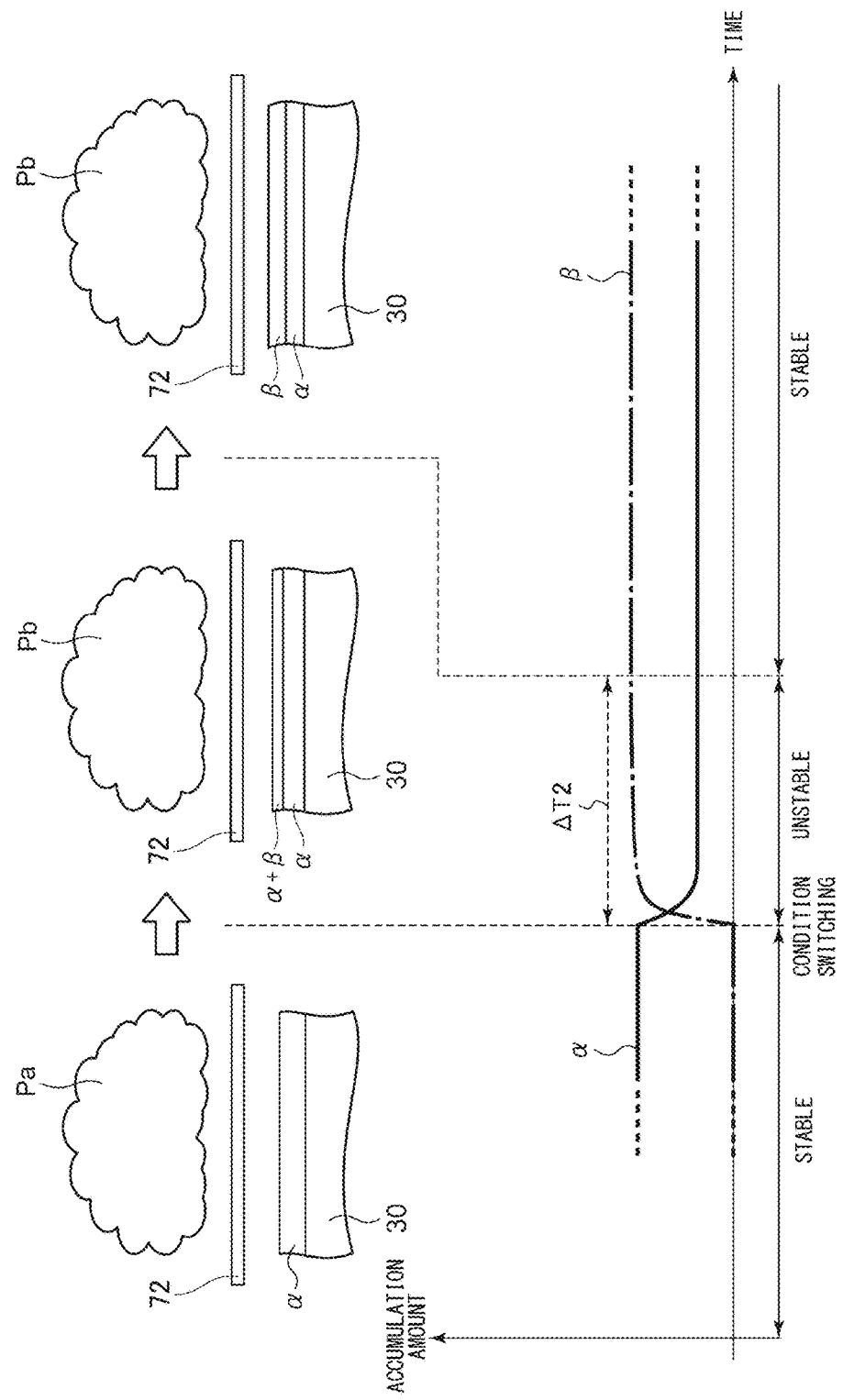
FIG. 6 is a view showing a state change of an inner wall of an arc chamber when ion generation conditions are switched according to the embodiment.

FIG. 6 is a view showing a state change of the inner wall of the arc chamber 30 when the ion generation conditions are switched according to the present embodiment and corresponds to FIG. 5 according to the above-described Comparative Example. In the present embodiment, the cage 72 is provided between the plasma and the inner wall of the arc chamber 30, and the temperature of the inner wall of the arc chamber 30 is lower than that of the cage 72. As a result, compared to the case of Comparative Example, the accumulation substances α and β are easily accumulated on the inner wall of the arc chamber 30, and the substances accumulated once are difficult to be emitted.

If the ion generation conditions are switched in the present embodiment, as shown in the center upper portion of FIG. 6, the inner wall state is transferred to a state where both of the first substance α and the second substance β are accumulated on the first substance α accumulated on the inner wall of the arc chamber 30. The reason is because the first substance α is not easily emitted, the second substance β is easily accumulated, and thus, the second substance β covers the first substance α before the first substance α is completely removed. As a result, as shown in the right upper portion of FIG. 6, the second substance β is accumulated and saturated in a state where the first substance α remains on the inner wall of the arc chamber 30. In the present embodiment, the first substance α is completely covered with the second substance β, and thus, a stable state is realized in the new ion generation condition.

In the present embodiment, the first substance α finishes being emitted before the first substance α is completely removed, and thus, the time until the first substance α finishes being emitted is shorter than that of the above-described Comparative Example. Because the temperature of the inner wall of the arc chamber 30 is relatively low, the time until the second substance β is accumulated and saturated on the inner wall is shorter than that of the above-described Comparative Example. As a result, as shown in the lower portion of FIG. 6, a waiting time $\Delta T_2$ until the ion generation conditions are switched and stabilized is shorter than that of the above-described Comparative Example. According to the present embodiment, in this way, the waiting time caused by the switching of the ion generation conditions is shortened, and thus, it is possible to improve productivity of the ion implanter 10.

Figure 7:
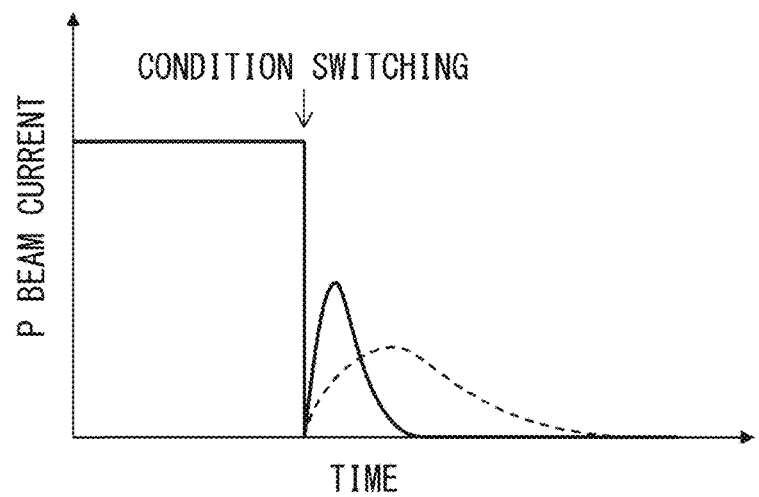
FIG. 7 is a view showing a change of a beam current when the ion generation conditions are switched.

FIG. 7 is a view showing a change of a beam current when the ion generation conditions are switched, and shows the change of the beam current of a phosphorus ion beam (P beam) in a case where the conditions are switched from a generation conditions for phosphorus (P) ions to a generation condition for argon (Ar) ions. A solid line indicates a beam current change for the present embodiment in which the cage 72 is provided in the arc chamber 30 and a dashed line indicates a beam current change for Comparative Example in which the cage 72 is not provided in the arc chamber. As shown in the drawings, compared to Comparative Example, in the present embodiment, a time until the P beam is sufficiently decreased after the ion generation conditions are switched is short, and a time integrated value of the beam current of the P beam output after the switching is small. In this way, according to the present embodiment, it is possible to shorten the waiting time caused by the switching of the ion generation conditions.

Figure 8:
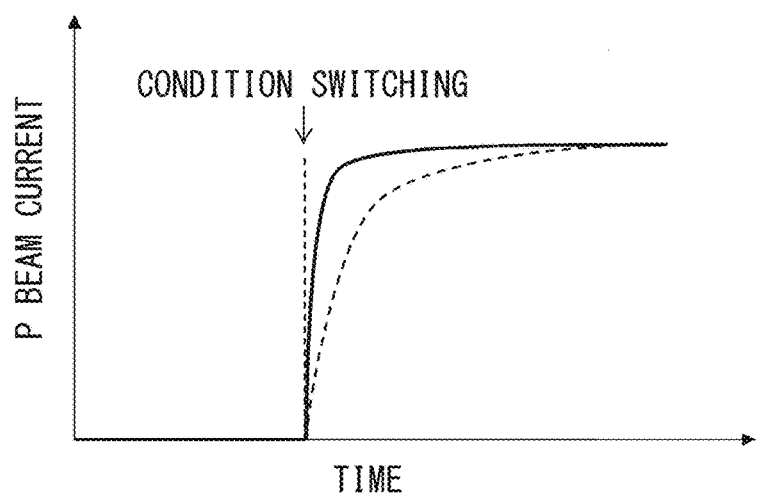
FIG. 8 is a view showing the change of the beam current when the ion generation conditions are switched.

FIG. 8 is a view showing the change of the beam current when the ion generation conditions are switched, and in contrast with the case of FIG. 7, FIG. 8 shows the change of the beam current of the P beam in a case where the conditions are switched from a generation conditions of argon (Ar) ions to a generation conditions of phosphorus (P) ions. A solid line indicates beam current change for the present embodiment in which the cage 72 is provided in the arc chamber 30 and a dashed line indicates a beam current change for Comparative Example in which the cage 72 is not provided in the arc chamber. As shown in the drawings, compared to Comparative Example, in the present embodiment, a time until the P beam current is substantially stabilized after the ion generation conditions are switched is short. In this way, according to the present embodiment, it is possible to shorten the waiting time caused by the switching of the ion generation conditions.

MODIFICATION EXAMPLE 1

FIGS. 9A to 9C are sectional views schematically showing configurations of cages 72a, 72b, and 72c according to Modification Example 1 and show cross sections when the inside of the arc chamber 30 is viewed in the axial direction. FIG. 9A shows the cage 72a which is formed in a U shape when viewed in the axial direction. FIG. 9B shows the cage 72b which is formed in a C shape when viewed in the axial direction. FIG. 9C shows the cage 72c which is formed in a V shape when viewed in the axial direction. In the shown Modification Example 1, each of the cages 72a, 72b, and 72c is disposed to partition a portion between the region in which the plasma P is generated and the inner surface 45 of the arc chamber 30 and is attached to the slit member 46. The shape of the cage is not limited to those of the shown cages, and an arbitrary shape can be adopted as long as it partially surrounds the plasma generating region.

MODIFICATION EXAMPLE 2

Figure 10:
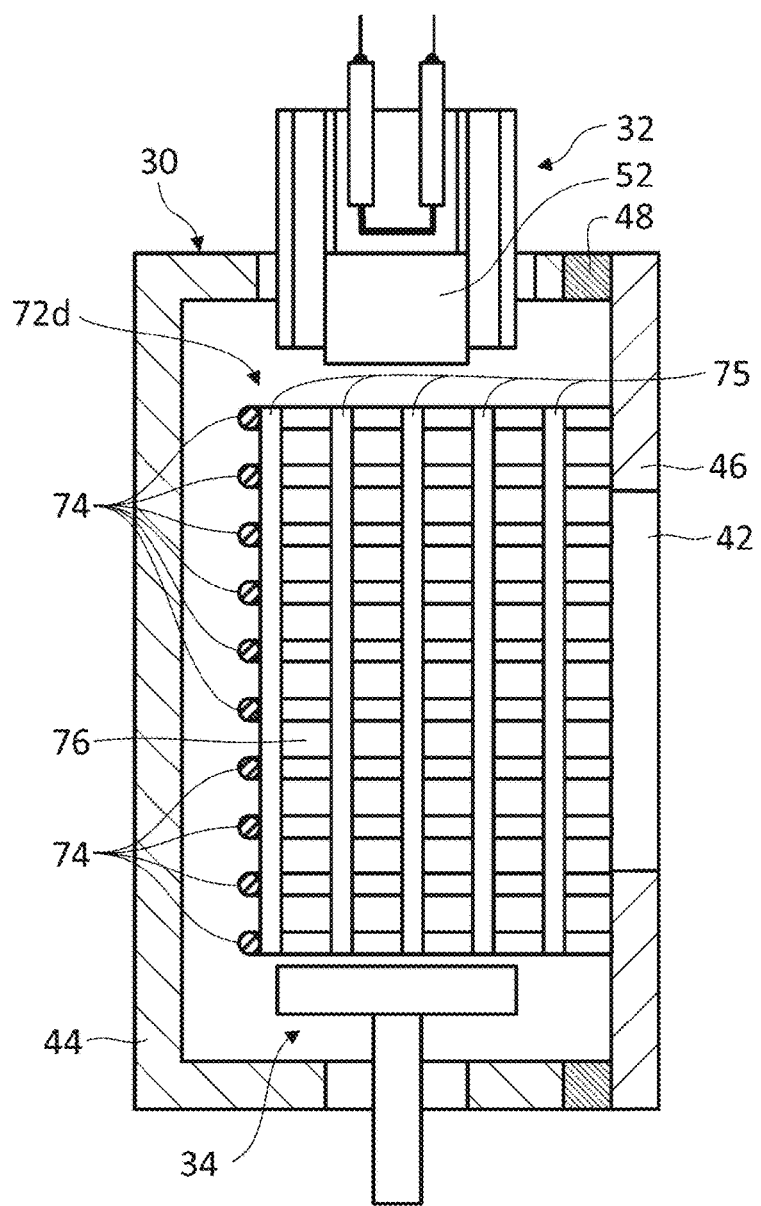
FIG. 10 is a sectional view schematically showing a configuration of a cage according to Modification Example 2.

FIG. 10 is a sectional view schematically showing a configuration of a cage 72d according to Modification Example 2 and shows a cross section when the inside of the arc chamber 30 is viewed in the slit width direction. In the cage 72d according to Modification Example 2, a plurality of second wire members 75 extending in the axial direction are provided in addition to the plurality of wire members (first wire members) 74 which are disposed with intervals in the axial direction. The second wire members 75 are disposed at intervals in the direction in which the first wire members 74 extend. The cage 72d according to Modification Example 2 is formed in a mesh shape by using a combination of the first wire members 74 and the second wire members 75. That is, the cage 72d includes a mesh member. Preferably, in Modification Example 2, the opening ratio of the gaps 76 of the mesh is 30% or more and 90% or less.

MODIFICATION EXAMPLE 3

Figure 11:
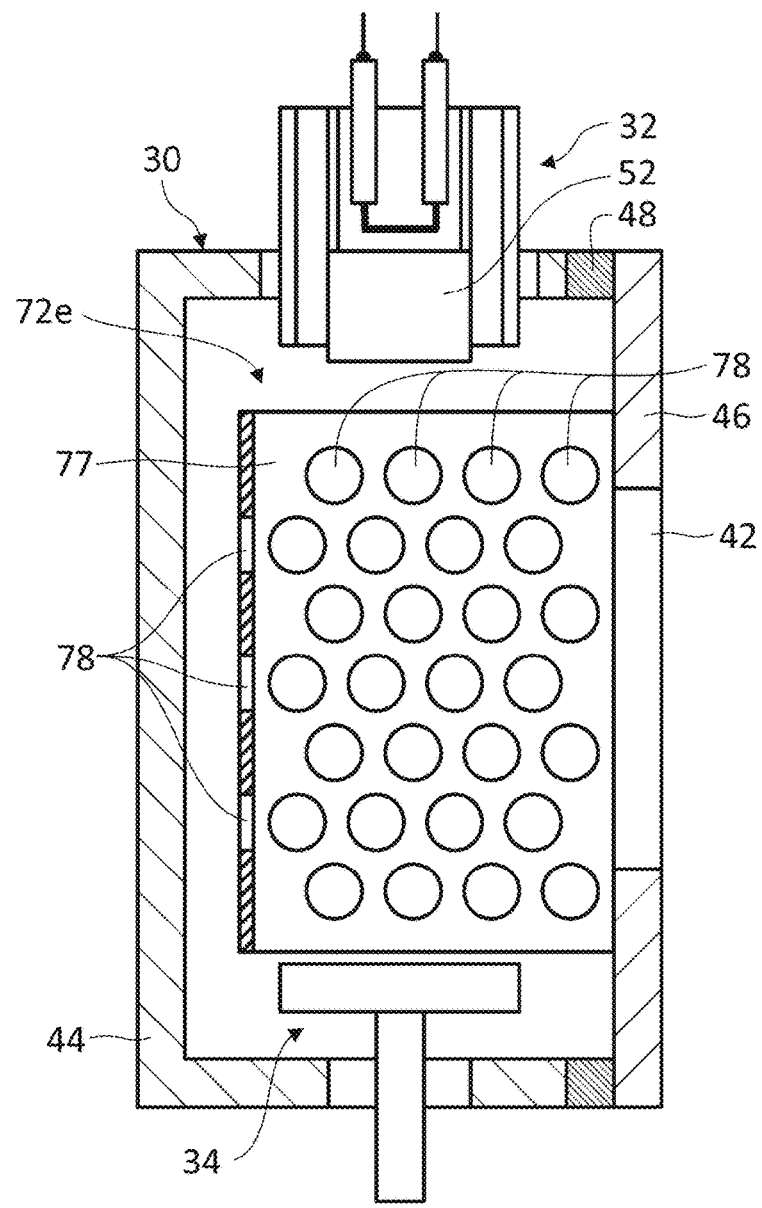
FIG. 11 is a sectional view schematically showing a configuration of a cage according to Modification Example 3.

FIG. 11 is a sectional view schematically showing a configuration of a cage 72e according to Modification Example 3, and similarly to FIG. 10, shows a cross section when the inside of the arc chamber 30 is viewed in the slit width direction. The cage 72e according to Modification Example 3 is configured of plate members 77 having a plurality of openings 78. The cage 72e has a squared U shape when viewed in the axial direction and includes three plate members 77 which are disposed to respectively face the three side portions of the chamber body 44. The plurality of openings 78 are formed in an array on the plate member 77, and, for example, are arranged in a trigonal lattice alignment or a tetragonal lattice alignment. In Modification Example 3, preferably, the opening ratio of the plurality of openings 78 is 30% or more and 90% or less.

MODIFICATION EXAMPLE 4

Figure 12A:
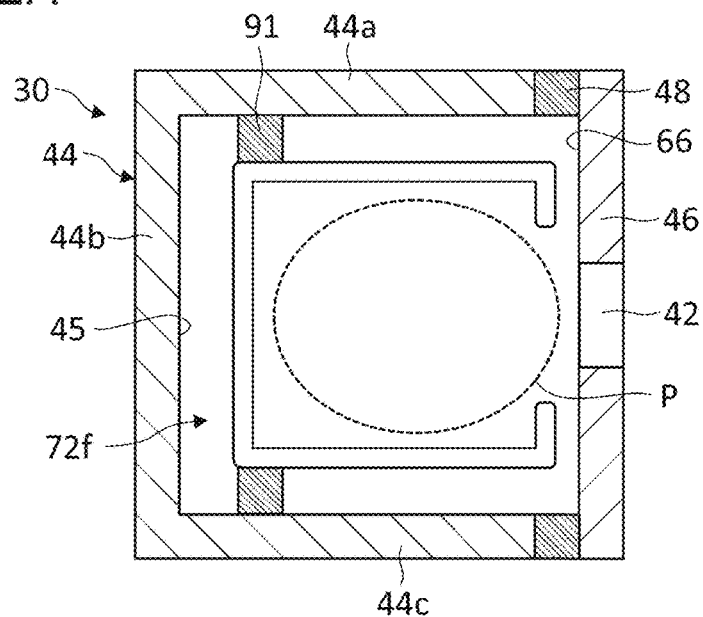
FIGS. 12A and 12B are sectional views schematically showing internal configurations of arc chambers according to Modification Example 4.
Figure 12B:
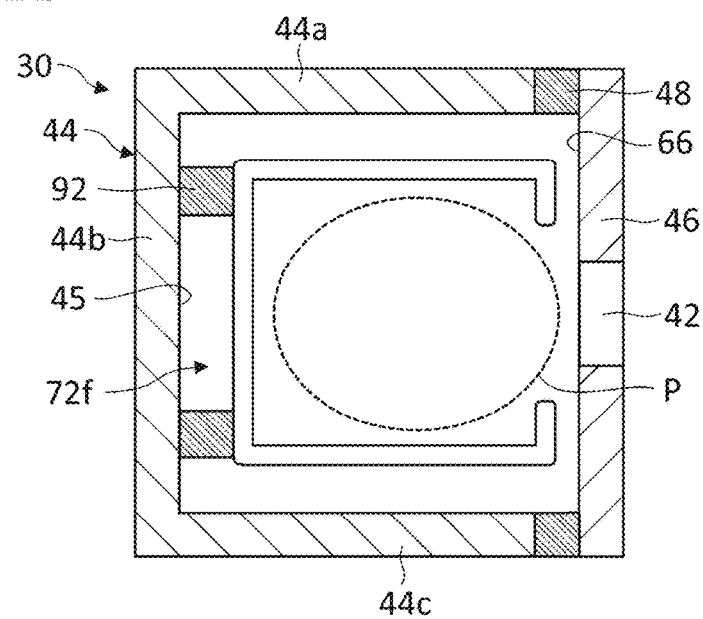

FIGS. 12A and 12B are sectional views schematically showing internal configurations of the arc chamber 30 according to Modification Example 4, and show cross sections when the inside of the arc chamber 30 is viewed in the axial direction. Modification Example 4 is different from the above-described embodiment in that the cage 72f is not fixed to the slit member 46 and is fixed to the chamber body 44. The cage 72f is disposed to be away from the inner surface 66 of the slit member 46 and is attached to the inner surface 45 of the chamber body 44 via insulating members 91 or 92. In Modification Example 4 shown in FIG. 12A, the cage 72f is fixed to two side portions 44a and 44c of the chamber body 44 facing each other in the slit width direction via the insulating members 91. In Modification Example 4 shown in FIG. 12B, the cage 72f is fixed to one side portion 44b of the chamber body 44 facing the slit member 46 via the insulating members 92.

In Modification Example 4, the cage 72f is electrically insulated from the chamber body 44, and thus, the cage 72f may have an electric potential different from that of the chamber body 44. For example, similarly to the above-described embodiment, the cage 72f is configured to have the same electric potential as that of the slit member 46. The cage 72f may be electrically insulated from the slit member 46 and may have an electric potential different from that of the slit member 46. In this case, a voltage may be applied to the cage 72f by using another power supply which is not shown in FIG. 2. The cage 72f may be configured to have a floating electric potential.

MODIFICATION EXAMPLE 5

Figure 13A:
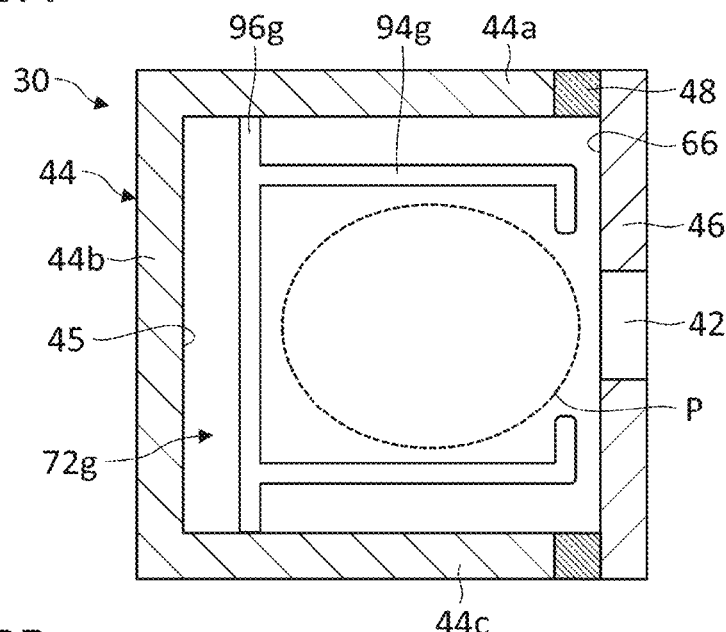
FIGS. 13A and 13B are sectional views schematically showing internal configurations of arc chambers according to Modification Example 5.
Figure 13B:
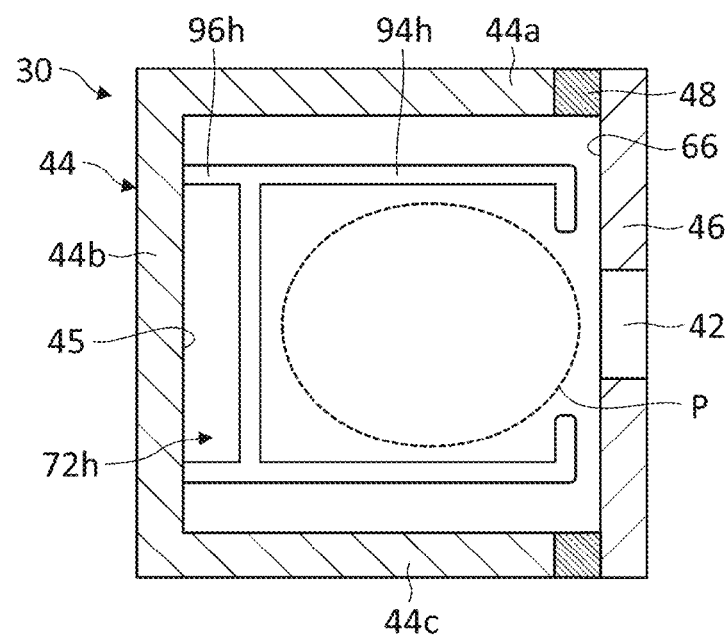

FIGS. 13A and 13B are sectional views schematically showing internal configurations of the arc chamber 30 according to Modification Example 5, and show cross sections when the inside of the arc chamber 30 is viewed in the axial direction. Modification Example 5 is similar to Modification Example 4 in that cage 72g or 72h is fixed to the chamber body 44. However, Modification Example 5 is different from Modification Example 4 in that the cages 72g and 72h are directly fixed to the chamber body 44. Accordingly, in Modification Example 5, the cage 72g or 72h is configured to have the same electric potential as that of the chamber body 44.

In Modification Example 5 shown in FIG. 13A, the cage 72g is fixed to the two side portions 44a and 44c of the chamber body 44 facing each other in the slit width direction. The cage 72g includes a partitioning portion 94g which is disposed to partially surround the plasma generating region and an attachment portion 96g which protrudes from the partitioning portion 94g toward the side portions 44a and 44c of the chamber body 44. In Modification Example 5 shown in FIG. 13B, the cage 72h is fixed to the one side portion 44b of the chamber body 44 facing the slit member 46. The cage 72h includes a partitioning portion 94h which is disposed to partially surround the plasma generating region and an attachment portion 96h which protrudes from the partitioning portion 94h toward the side portion 44b of the chamber body 44.

In another Modification Example, the cage 72 may not be fixed to the side portions of the chamber body 44 and may be fixed to the upper portion and/or the lower portion of the chamber body 44. In this case, the cage 72 maybe directly fixed to the chamber body 44 or may be fixed to the chamber body 44 via an insulating member.

It should be understood that the invention is not limited to the above-described embodiments, but may be modified into various forms on the basis of the spirit of the invention. Additionally, the modifications are included in the scope of the invention.

In the above-described embodiment, the case where the voltage generated by the chamber power supply 62 is applied between the chamber body 44 and the slit member 46 is shown. In still another Modification Example, the chamber power supply 62 may not be provided, and the chamber body 44 and the slit member 46 maybe configured to have the same electric potential as each other. In this case, the cage 72 may be configured to have the same electric potential as those of the chamber body 44 and the slit member 46, and the cage 72 may be configured to have an electric potential different from those of the chamber body 44 and the slit member 46. In the latter case, the cage 72 may be configured to have a floating electric potential with respect to the chamber body 44 and the slit member 46.

The above descriptions are made with reference to the ion generator with indirectly heated cathode. However, the present invention is not limited to this and may be applied to another arbitrary ion generator such as an RF ion generator, a microwave ion generator, or a Bernas type ion generator, in which a reactive material gas is supplied to a plasma chamber and react with an inner wall of the plasma chamber. In this case, the term "arc chamber" mentioned in the above description can be replaced by the term "plasma chamber" used as a more generalized expression.

What is claimed is:

1. An ion generator, comprising:
an arc chamber which has a plasma generating region therein;
a cathode configured to emit a thermoelectron toward the plasma generating region;
a repeller which faces the cathode in an axial direction in a state where the plasma generating region is interposed between the cathode and the repeller; and
a cage which is disposed to partially surround the plasma generating region at a position between an inner surface of the arc chamber and the plasma generating region.

2. The ion generator according to claim 1,
wherein the cage is disposed to avoid a position between the plasma generating region and the cathode and a position between the plasma generating region and the repeller.

3. The ion generator according to claim 1,
wherein the arc chamber includes an arc chamber body and a slit member provided with a front slit for extracting ions to outside of the arc chamber, and
wherein the cage is disposed to avoid a position between the plasma generating region and the front slit.

4. The ion generator according to claim 3,
wherein the cage is fixed to an inner surface of the slit member and is disposed to be away from an inner surface of the arc chamber body.

5. The ion generator according to claim 3,
wherein the cage is configured to have the same electric potential as that of the slit member.

6. The ion generator according to claim 3,
wherein the cage is fixed to an inner surface of the arc chamber body and is disposed to be away from an inner surface of the slit member.

7. The ion generator according to claim 6,
wherein the cage is configured to have the same electric potential as that of the arc chamber body.

8. The ion generator according to claim 6,
wherein the cage is fixed to the inner surface of the arc chamber body via an insulating member and is configured to have an electric potential different from that of the arc chamber body.

9. The ion generator according to claim 3,
wherein the slit member is attached to the arc chamber body via an insulating member, and
wherein the arc chamber body is configured to have a negative electric potential with respect to an electric potential of the slit member.

10. The ion generator according to claim 3,
wherein the slit member is attached to the arc chamber body via an insulating member, and
wherein the arc chamber body is configured to have a floating electric potential with respect to an electric potential of the slit member.

11. The ion generator according to claim 3, further comprising:
a cooling mechanism configured to cool the arc chamber body.

12. The ion generator according to claim 3,
wherein the front slit has an elongated shape in the axial direction, and
wherein the cage is disposed at least over a section where the front slit extends in the axial direction.

13. The ion generator according to claim 1,
wherein the cage is formed in a V shape, a U shape, a C shape, or a squared U shape when viewed from the axial direction.

14. The ion generator according to claim 1,
wherein the cage includes a plurality of openings or a plurality of gaps disposed to generate a flow of a gas crossing the cage in a radial direction orthogonal to the axial direction.

15. The ion generator according to claim 14,
wherein the cage is configured such that an area ratio occupied by the plurality of openings or the plurality of gaps occupied per unit area in a plan view from the radial direction is 30% or more and 90% or less.

16. The ion generator according to claim 1,
wherein the cage includes a plurality of wire members arranged with intervals in the axial direction.

17. The ion generator according to claim 1,
wherein the cage includes a mesh member.

18. The ion generator according to claim 1,
wherein the cage includes a plate member provided with a plurality of small holes.

\* \* \* \* \*